(12) United States Patent
Banine

(10) Patent No.: US 7,489,385 B2
(45) Date of Patent: Feb. 10, 2009

(54) LITHOGRAPHIC PROJECTION APPARATUS WITH COLLECTOR INCLUDING CONCAVE AND CONVEX MIRRORS

(75) Inventor: Vadim Yevgenyevich Banine, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 494 days.

(21) Appl. No.: 10/817,969

(22) Filed: Apr. 6, 2004

(65) Prior Publication Data

US 2004/0257546 A1 Dec. 23, 2004

(30) Foreign Application Priority Data

Apr. 17, 2003 (EP) .................................. 03076138

(51) Int. Cl.
*G03B 27/54* (2006.01)
(52) U.S. Cl. ....................................................... 355/67
(58) Field of Classification Search .................. 355/67, 355/53, 71; 359/27, 528; 430/24; 250/459.1
See application file for complete search history.

(56) References Cited

U.S. PATENT DOCUMENTS

| 3,892,476 A | * | 7/1975 | Sherman, Jr. ................ 359/853 |
| 4,199,686 A | * | 4/1980 | Brunsting et al. ......... 250/459.1 |
| 4,205,902 A | * | 6/1980 | Shafer ......................... 359/366 |
| 4,863,253 A | * | 9/1989 | Shafer et al. ................. 359/859 |
| 5,003,567 A | | 3/1991 | Hawryluk et al. |
| 5,022,064 A | * | 6/1991 | Iketaki ........................ 378/145 |
| 5,144,497 A | | 9/1992 | Kato et al. |
| 5,291,339 A | * | 3/1994 | Mochimaru et al. ......... 359/859 |
| 5,345,292 A | * | 9/1994 | Shiozawa et al. .............. 355/67 |
| 5,515,207 A | | 5/1996 | Foo |
| 5,737,137 A | * | 4/1998 | Cohen et al. ................. 359/859 |
| 5,912,741 A | | 6/1999 | Carter et al. |
| 6,359,969 B1 | * | 3/2002 | Shmaenok ................... 378/156 |
| 6,639,652 B1 | | 10/2003 | Mori et al. |
| 6,954,266 B2 | * | 10/2005 | Tomie ...................... 356/237.1 |
| 2003/0223544 A1 | * | 12/2003 | Murakami ................... 378/119 |

FOREIGN PATENT DOCUMENTS

| EP | 1 274 287 A1 | 1/2003 |
| JP | 7-169677 A | 7/1995 |
| JP | 2000-353418 | 12/2000 |
| JP | 2001-185480 | 7/2001 |
| JP | 2003-22950 A | 1/2003 |
| JP | 2003-31483 A | 1/2003 |
| WO | WO 99/03008 | 1/1999 |

OTHER PUBLICATIONS

Korean Office Action issued in 10-2004-0026057 dated Apr. 27, 2006.
Singapore Written Opinion issued in Singapore Patent Application No. 200402029-3 dated Dec. 7, 2007.

* cited by examiner

*Primary Examiner*—Peter B Kim
(74) *Attorney, Agent, or Firm*—Pillsbury Winthrop Shaw Pittman, LLP

(57) ABSTRACT

An optical system includes a radiation source and at least one collector located in the vicinity of the radiation source. The collector is arranged to collect the radiation to provide a beam of radiation. The at least one collector includes a first reflector on a concave surface and a second reflector on a convex surface, the concave surface surrounding the convex surface.

29 Claims, 5 Drawing Sheets

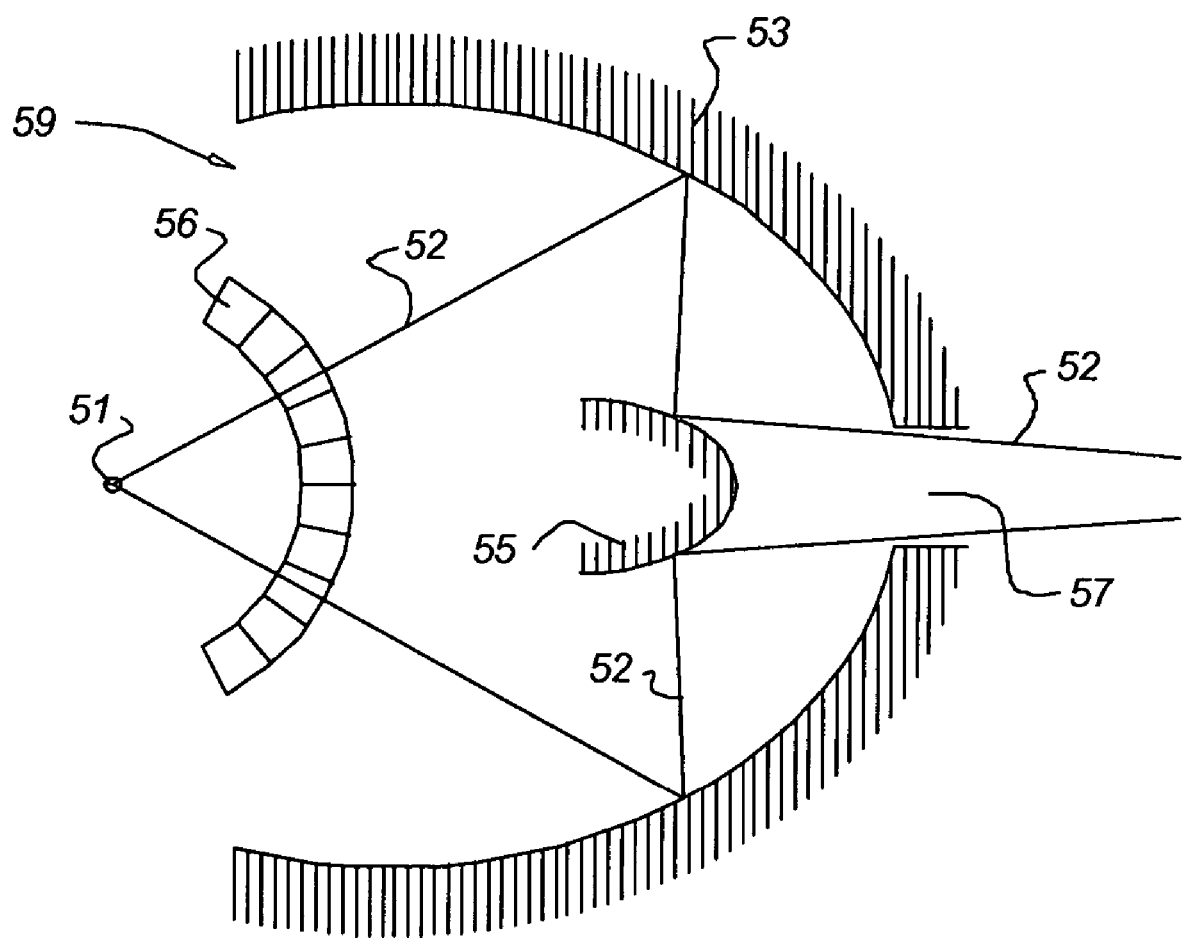

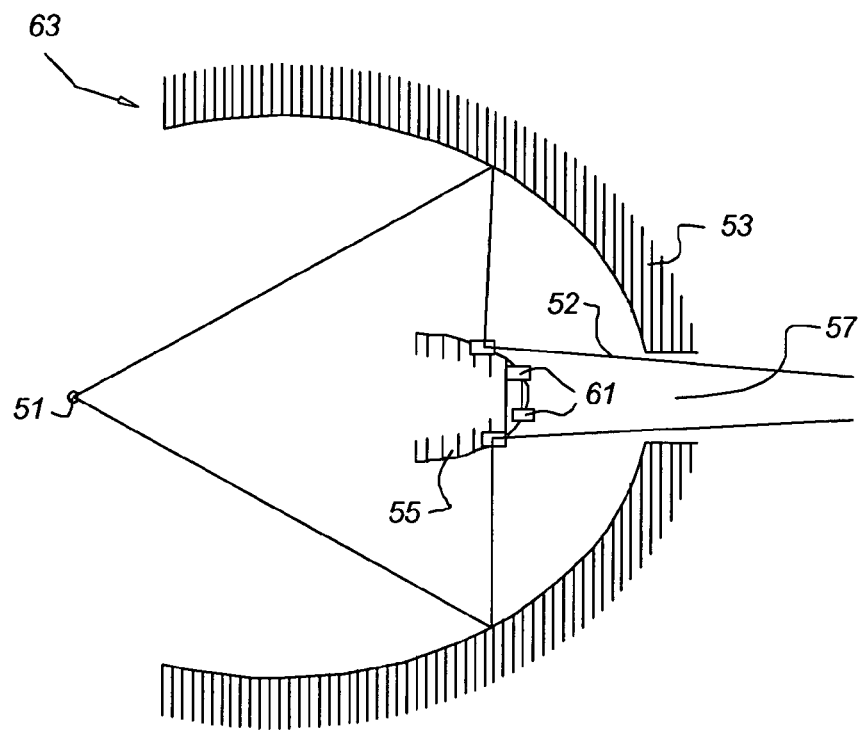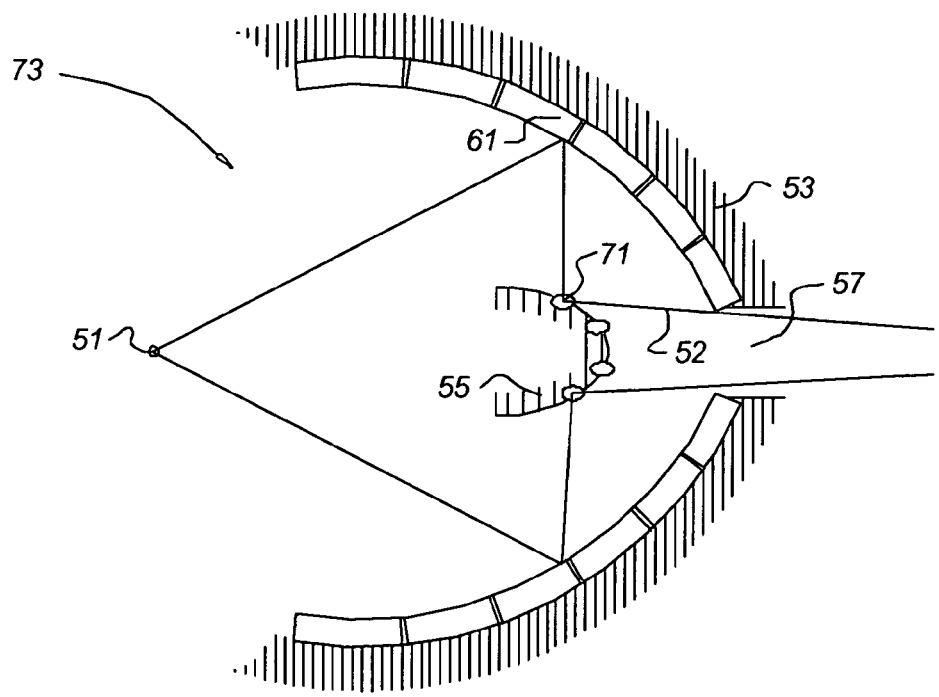

LITHOGRAPHIC PROJECTION APPARATUS WITH COLLECTOR INCLUDING CONCAVE AND CONVEX MIRRORS

CROSS REFERENCES TO RELATED APPLICATIONS

This application claims priority to European Application 03076138.1, filed Apr. 17, 2003, the entire contents of which are herein incorporated by reference.

BACKGROUND OF THE INVENTION

1. Field of the Invention

The present invention relates to an optical system including a radiation source and at least one collector located in the vicinity of the radiation source for collecting the radiation to provide a beam of radiation.

2. Description of the Related Art

Every lithographic projection apparatus utilizes a radiation source. The radiation source provides illumination power. As the radiation source is mostly point like in shape, the radiation emitted by the radiation source is highly divergent in character. Therefore, collectors are used to focus the radiation into a more convergent radiation beam. Radiation that is not collected means a loss in illumination power. Hence, it is important to collect the radiation in as big a solid angle as possible. Multilayer (ML) collectors are able to collect radiation from such a small radiation source in a solid angle of more than $2\pi$ sr (although practical angles are in between $1.4\pi$ sr to $1.63\pi$ sr) and provide a radiation beam. Presently, however, there is no adequate alternative for ML collectors available with a large collector angle.

SUMMARY OF THE INVENTION

It is an aspect of the present invention to provide a collector that provides an EUV radiation beam with radiation collected from a solid angle which is in size comparable to the solid angle in which ML collectors collect radiation.

According to a first embodiment of the present invention, a collector includes a first reflector on a concave surface and a second reflector on a convex surface, the convex surface surrounding the concave surface, and the first reflector on the concave surface being configured to receive the radiation from the radiation source and reflect it to the second reflector on the convex surface to produce the beam of radiation. Collection of an amount of radiative power comparable to ML collectors is in this way possible.

According to a further embodiment of the present invention, the first reflector includes field facets. This allows one mirror conventionally present in the illumination system downstream of the optical system to be omitted. When EUV radiation impinges on a mirror, about 30% of the radiative power is absorbed. Consequently, by omitting one mirror this embodiment of the optical system dissipates substantially less radiative power in the lithographic projection apparatus.

According to a further embodiment of the present invention, the first reflector includes pupil facets and the second reflector includes field facets. Again, one less mirror is needed in the illumination system downstream of the optical system. Consequently, a further reduction in the dissipation of radiative power in the lithographic projection apparatus may be obtained.

According to a further embodiment of the present invention, an optical system includes a radiation source and a collector as described above. The optical system may further include a contamination reduction device located between the radiation source and the collector and configured to let the radiation pass through. A clean radiation beam is desirable to obtain a lithographic projection with minimal irregularities (debris). The contamination reduction device (e.g. a foil trap) results in a reduced amount of debris in the radiation downstream of the contamination reduction device.

According to a further aspect of the present invention, a lithographic projection apparatus includes a radiation system configured to form a beam of radiation from radiation emitted by a radiation source, a support configured to hold a patterning device to be irradiated by the beam to pattern the projection beam, a substrate table configured to hold a substrate, and a projection system configured to image an irradiated portion of the patterning device onto a target portion of the substrate, wherein the lithographic projection apparatus includes a collector or an optical system as described above.

According to a further aspect of the present invention, a method of manufacturing an integrated structure includes providing a beam of radiation from radiation emitted by a radiation source by collecting the radiation with a reflector having a convex surface and reflecting the radiation from the convex surface to a reflector having a concave surface, the convex surface surrounding the concave surface, patterning the beam of radiation in its cross-section, and projecting the patterned beam of radiation onto a target portion of a substrate at least partially covered by a layer of radiation sensitive material.

The term "patterning device" as employed above should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can include one or more programmable mirror arrays. More information on mirror arrays can be seen, for example, from U.S. Pat. Nos. 5,296,891 and 5,523,193, and PCT Publications WO 98/38597 and WO 98/33096, hereby incorporated by reference. In the case of a programmable mirror array, the support may be embodied as a frame or table, for example, which may be fixed or movable as required.

Another example is a programmable LCD array. An example of such a construction is given in U.S. Pat. No. 5,229,872, hereby incorporated by reference. As above, the support may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792, hereby incorporated by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, hereby incorporated by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF THE DRAWINGS

The present invention will now be explained in connection with the accompanying drawings, which are only intended to show examples and not to limit the scope of protection, and in which:

FIG. 5 is an optical system comprising a Schwarzschild collector according to the present invention;

FIG. 6 is a Schwarzschild collector with field facets on the concave mirror; and FIG. 7 is a Schwarzschild collector with pupil facets on the convex mirror.

In the drawings, like reference characters refer to like elements.

DETAILED DESCRIPTION

Figure 1:
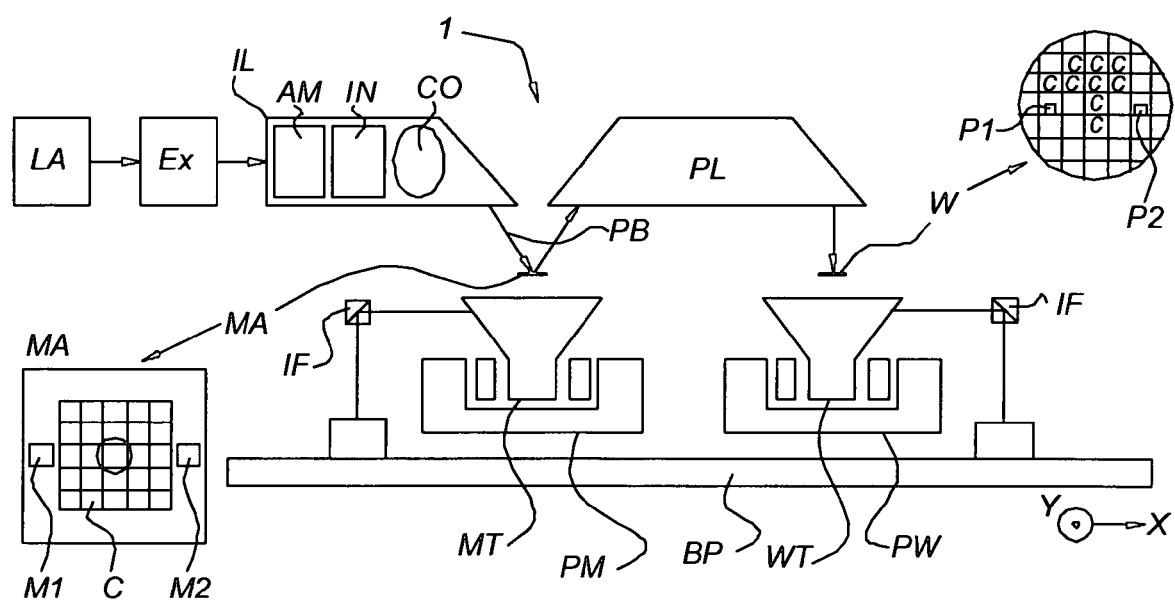
FIG. 1 represents a schematic general overview of a lithographic projection apparatus according to the present invention.

FIG. 1 schematically depicts a lithographic projection apparatus 1 according to an embodiment of the present invention. The apparatus includes a radiation system Ex, IL configured to supply a beam PB of radiation, among which all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm). In this particular case, the radiation system also includes a radiation source LA.

A first object table (mask table) MT is provided with a mask holder configured to hold a mask MA (e.g. a reticle), and connected to a first positioning device PM that accurately positions the mask with respect to a projection system ("lens") PL. A second object table (substrate table) WT is provided with a substrate holder configured to hold a substrate W (e.g. a resist-coated silicon wafer), and is connected to a second positioning device PW that accurately positions the substrate with respect to the projection system PL.

The projection system ("lens") PL is configured to image an irradiated portion of the mask MA onto a target portion C (e.g. including one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a laser-produced plasma or a discharge plasma EUV radiation source) produces a beam of radiation PB. This beam is fed into an illumination system (illuminator) IL, either directly or after having traversed a conditioning device, such as a beam expander Ex, for example. The illuminator IL may include an adjusting device AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring system IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the beam of radiation PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
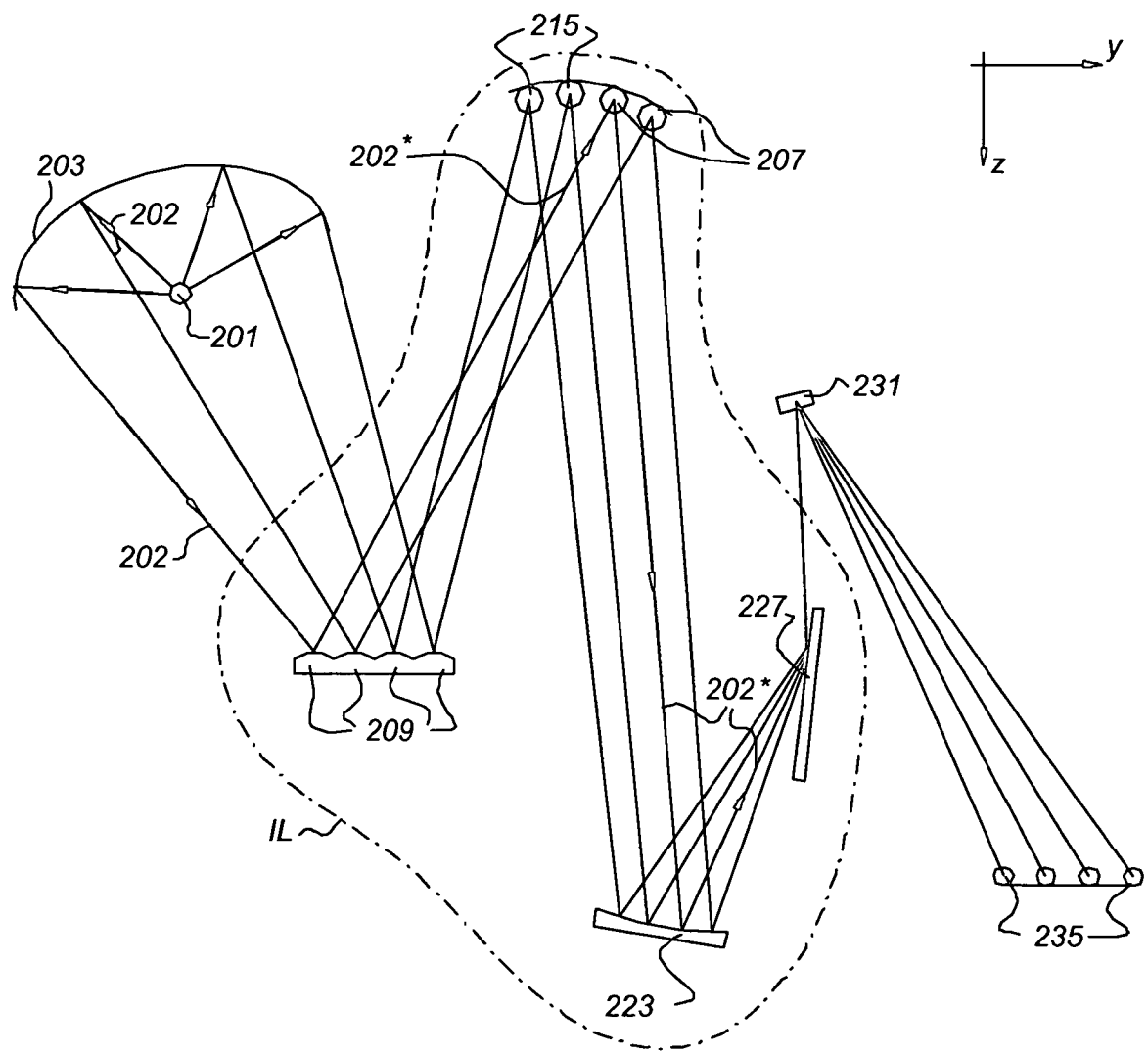
FIG. 2 is a more detailed representation of a portion of FIG. 1.

The illumination system IL is shown in greater detail in FIG. 2. The illumination system may be similar to the one described in detail in U.S. Pat. No. 6,438,199.

The arrangement shown in FIG. 2 includes a radiation source 201 from which radiation beams 202 originate. Behind the radiation source 201 a convex mirror 203 is located. In front of the radiation source separate convex mirrors 209, so called field facets, are positioned. Each of the field facets 209 reflects the incoming radiation beam 202 towards corresponding mirrors 215. The mirrors 215 are also called pupil facets. Subsequently, the radiation beam 202 reflects onto a mirror 223 which is a concave mirror and onto a convex mirror 227 which is arranged at grazing incidence. The separate radiation beams 202 form a separate images 235 of the radiation source 201 after reflection from a patterning device 231.

The radiation beams 202 after leaving the source 201 are collected by the convex mirror 203 which is ellipsoidal shaped. The mirror 203 sends the radiation beams 202 towards the convex mirrors 209. Here the radiation beam is split into as many separate radiation beams 202* as there are mirrors 209. The convex mirrors 209 reflect each radiation beam towards a particular pupil facet 215. The pupil facets 215 are arranged in the focus of the radiation beams 202*, thereby creating point like (secondary) sources 207. Due to their position in the focus of the radiation beams 202*, the pupil facets may be designed as planar mirrors. Alternatively, since the intensity of the radiation beams 202* in the focus can be quite high, the pupil facets 215 may be arranged out of focus.

However, the distance between a secondary source 207 and a respective planar mirror should not be more than 20% of the distance between a convex mirror 209 and a pupil facet 215 for a radiation beam 202*. Which particular convex mirror 209 reflects a radiation beam onto which pupil facet 215 is user defined. To this end, the convex mirrors 209 and the pupil facets 215 may be individually tilted. The convex mirror 223 and the mirror 227 at grazing incidence function as collimating lens. The individual radiation beams 202* are superimposed at the patterning device 231 and diverge after being reflected.

Figure 3:
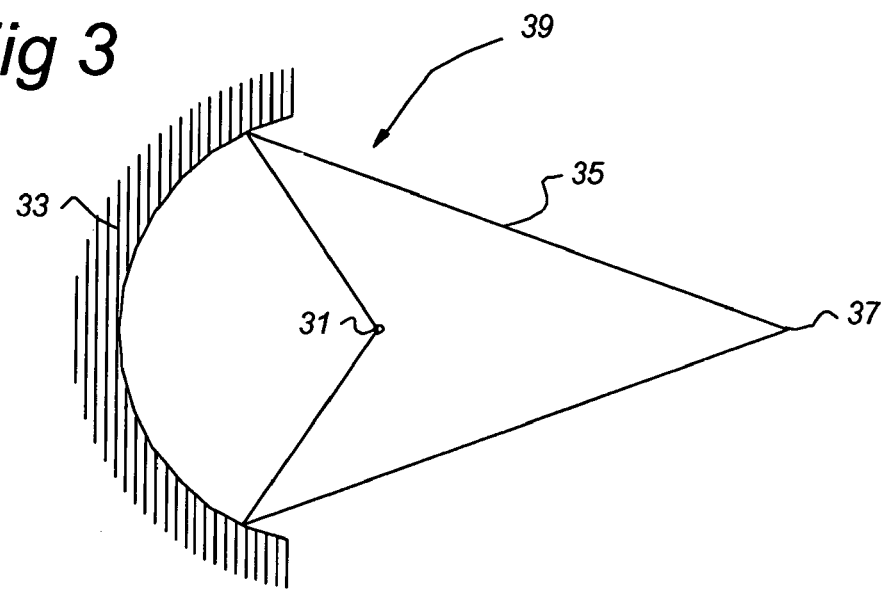
FIG. 3 is a representation of a ML collector according to the current state of the art.

In FIG. 3 an optical system 39 is shown that may be used to obtain a high intensity radiation beam 35 in a focal point 37. The optical system includes a ML collector 33 and a radiation source 31.

The radiation from the radiation source 31 is reflected via the ML collector 33 into the focal point 37. This radiation is highly divergent in character, but depending on the location of the radiation source 31 and the shape of the ML collector 33, which in FIG. 3 is shaped like half a sphere, radiation from a solid angle of about $2\pi$ sr may be collected into the focal point 37.

Figure 4:
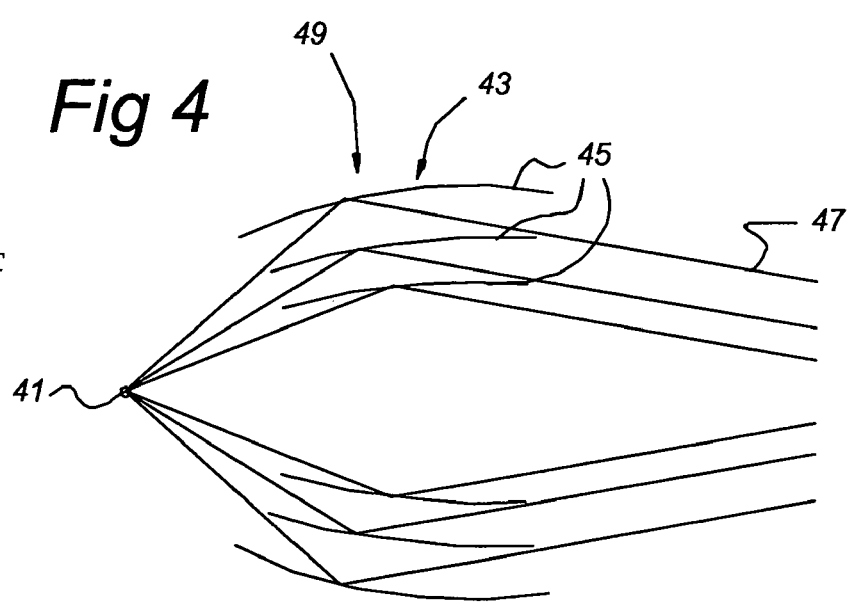
FIG. 4 is a representation of a grazing incidence (GI) collector according to the current state of the art.

In FIG. 4 another optical system 49 to obtain a high intensity radiation beam 47 is shown. The system 49 comprises a radiation source 41. In the vicinity of the radiation source 41 a grazing incidence (GI) collector 43 is located. The GI collector 43 includes several reflecting layers 45.

Radiation from the radiation source 41 is reflected against the layers 45 and focused in a focal point (not shown). In this optical system 49, radiation from a solid angle less than $2\pi$ sr may be collected into the focal point. Grazing incidence (GI) collectors can be combined with contamination mitigating systems. However, a major drawback of GI collectors is that their radiation collecting angle is limited ($1.1\pi$ sr to $1.2\pi$ sr) resulting in limited radiation yields.

In FIG. 5 an optical system 59 including a collector is shown. The system 59 includes a radiation source 51 radiating radiation 52 and a collector. The collector includes a mirror 55 having a convex reflecting surface surrounded by a mirror 53 having a concave reflecting surface. In the mirror 53 a hole 57 is present.

Radiation 52 from the radiation source 51 is reflected first against the mirror 53 and then against the mirror 55. The radiation 52 exits the optical system 59 via the hole 57. The mirror 53, due to its particular shape and due to the location of the radiation source 51, collects radiation from a solid angle of about $2\pi$ sr. The radiation is focused in a focal point (not shown).

In the set up shown in FIG. 5 it is possible to provide a contamination reduction device 56 between the radiation source 51 and the mirror 55. This contamination reduction device 56 may be a foil trap, e.g., similar to one described in U.S. Pat. Nos. 6,614,505 and 6,359,969. After leaving the hole 57, the radiation 52 is directed to the illumination system IL, e.g., to the field facets 209 of the illumination system IL shown in FIG. 2.

In FIG. 6 the reference numerals corresponding to the reference numerals of FIG. 5 refer to the same parts. In FIG. 6 field facets 61 are present on the mirror 55 of an optical system 63. The field facets 61 decompose the radiation beam 52 into individual radiation sources with their origin in the individual field facets 61. Presently, this composition takes place in the illumination system (IL) as described in connection with Fig. 2. By mounting the field facets 61 on the mirror 55, the filed facets 209 downstream of the optical system 63 may be omitted. This is advantageous, since every time the radiation beam hits a mirror, approximately 30% of the radiation power is absorbed.

In FIG. 7 reference numerals corresponding to the reference numerals of FIG. 5 refer to the same parts. In FIG. 7, field facets 61 are present on the mirror 53 of an optical system 73 and pupil facets 71 are present on the mirror 55. In this arrangement, one less mirror compared to the arrangement of FIG. 6 is required, which results in correspondingly more radiation power.

The various exemplary collectors 59, 63, 73 described above may be used in existing lithographic projection apparatus. For example, any of the various exemplary collectors 59, 63, 73 described above may be exchanged for the ML collector 33 shown in FIG. 3 or the GI collector 43 shown in FIG. 4 without having to change the location of the radiation source 31 or 41, respectively, or affecting the location of the focal point.

While exemplary embodiments of the present invention have been described, it should be appreciated that various modifications are possible without departing from the spirit and scope of the present invention. The description is not intended to limit the invention.

What is claimed is:

1. An optical system, comprising:
   a radiation source; and
   a collector located in a vicinity of the radiation source configured to collect radiation to provide a beam of radiation, wherein the collector comprises a first reflector on a concave surface and a second reflector on a convex surface, the concave surface surrounding the convex surface, wherein the first reflector is configured to collect radiation from a solid angle of about $2\pi$ sr and the first reflector includes an aperture in the concave surface configured to allow radiation reflected by the convex surface to pass therethrough.

2. An optical system according to claim 1, wherein the second reflector comprises field facets.

3. An optical system according to claim 1, wherein the second reflector comprises pupil facets and the first reflector comprises field facets.

4. An optical system according to claim 1, wherein the optical system further comprises a contamination reduction device configured to allow said radiation to pass therethrough.

5. An optical system according to claim 4, wherein the contamination reduction device comprises a foil trap.

6. An optical system according to claim 1, wherein the radiation source is configured to supply radiation having a wavelength between 5 and 20 nm.

7. A lithographic projection apparatus, comprising:
   a radiation system configured to form a beam of radiation from radiation emitted by a radiation source;
   a support configured to hold a patterning device to be irradiated by the beam to pattern the beam of radiation;
   a substrate table configured to hold a substrate;
   a projection system configured to image an irradiated portion of the patterning device onto a target portion of the substrate;
   an optical system including a radiation source; and
   a collector located in a vicinity of the radiation source configured to collect radiation to provide a beam of radiation, wherein collector comprises a first reflector on a concave surface and a second reflector on a convex surface, the concave surface surrounding the convex surface, wherein the first reflector is configured to collect radiation from a solid angle of about $2\pi$ sr and the first reflector includes an aperture in the concave surface configured to allow radiation reflected by the convex surface to pass therethrough.

8. An apparatus according to claim 7, wherein the second reflector comprises field facets.

9. An apparatus according to claim 7, wherein the second reflector comprises pupil facets and the first reflector comprises field facets.

10. An apparatus according to claim 7, wherein the optical system further comprises a contamination reduction device configured to allow said radiation to pass therethrough.

11. An apparatus according to claim 10, wherein the contamination reduction device comprises a foil trap.

12. An apparatus according to claim 7, wherein the beam of radiation has a wavelength between 5 and 20 nm.

13. A method of manufacturing an integrated structure, comprising:

provinding a beam of radiation from radiation emitted by a radiation source by collecting the radiation with a first reflector having a concave surface and reflecting the radiation from the concave surface to a second reflector having a convex surface, and passing the radiation by the convex surface through an aperture in the concave surface, the concave surface surrounding the convex surface;

patterning the beam of radiation in its cross-section; and projecting the patterned beam of radiation onto a target portion of a substrate at least partially covered by a layer of radiation sensitive material, wherein collecting the radiation includes collecting radiation from a solid angle of about $2\pi$ sr.

14. A method according to claim 13, wherein the convex surface comprises field facets.

15. A method according to claim 13, wherein the convex surface comprises pupil facets and the concave surface comprises field facets.

16. A method according to claim 13, further comprising reducing contamination of the radiation.

17. A method according to claim 13, wherein the beam of radiation has a wavelength between 5 and 20 nm.

18. A lithographic projection apparatus, comprising:

a radiation system configured to form a beam of radiation from radiation emitted by a radiation source;

a support configured to hold a patterning device to be irradiated by the beam to pattern the beam of radiation;

a substrate table configured to hold a substrate;

a projection system configured to image an irradiated portion of the patterning device onto a target portion of the substrate; and a collector configured to collect radiation from the radiation source to provide a beam of radiation, wherein the collector comprises a first reflector on a concave surface and a second reflector on a convex surface, the concave surface surrounding the convex surface, wherein the first reflector is configured to collect radiation from a solid angle of about $2\pi$ sr and the first reflector includes an aperture in the concave surface configured to allow radiation reflected by the convex surface to pass therethrough.

19. An apparatus according to claim 18, wherein the second reflector comprises field facets.

20. An apparatus according to claim 18, wherein the second reflector comprises pupil facets and the first reflector comprises field facets.

21. An apparatus according to claim 18, wherein the collector further comprises a contamination reduction device configured to allow said radiation to pass therethrough.

22. An apparatus according to claim 21, wherein the contamination reduction device comprises a foil trap.

23. An apparatus according to claim 18, wherein the beam of radiation has a wavelength between 5 and 20 nm.

24. A collector configured to collect radiation from a radiation source and produce a beam of radiation, the collector comprising:

a first reflector on a concave surface; and a second reflector on a convex surface, the concave surface surrounding the convex surface, wherein the first reflector on the concave surface is configured to receive the radiation from the radiation source and reflect it to the second reflector on the convex surface to produce the beam of radiation, wherein the first reflector is configured to collect radiation from a solid angle of about $2\pi$ sr and the first reflector includes an aperture in the concave surface configured to allow radiation reflected by the convex surface to pass therethrough.

25. A collector according to claim 24, wherein the second reflector comprises field facets.

26. A collector according to claim 24, wherein the second reflector comprises pupil facets and the first reflector comprises field facets.

27. A collector according to claim 24, further comprising a contamination reduction device configured to allow said radiation to pass therethrough.

28. A collector according to claim 27, wherein the contamination reduction device comprises a foil trap.

29. A collector according to claim 24, wherein the beam of radiation has a wavelength between 5 and 20 nm.

* * * * *